US012658850B2

(12) United States Patent (10) Patent No.: US 12,658,850 B2
Mizugaki (45) Date of Patent: Jun. 16, 2026

(54) CIRCUIT APPARATUS AND OSCILLATOR

(71) Applicant: SEIKO EPSON CORPORATION, Tokyo (JP)

(72) Inventor: Koichi Mizugaki, Suwa (JP)

(73) Assignee: SEIKO EPSON CORPORATION (JP)

( * ) Notice: Subject to any disclaimer, the term of this patent is extended or adjusted under 35 U.S.C. 154(b) by 0 days.

(21) Appl. No.: 18/966,551

(22) Filed: Dec. 3, 2024

(65) Prior Publication Data

US 2025/0192722 A1 Jun. 12, 2025

(30) Foreign Application Priority Data

Dec. 6, 2023 (JP) ................................. 2023-205932

(51) Int. Cl.
| | |
|---|---|
| *H03B 5/04* | (2006.01) |
| *G01R 23/02* | (2006.01) |
| *H03B 5/08* | (2006.01) |
| *H03B 5/32* | (2006.01) |
| *H03L 1/02* | (2006.01) |

(52) U.S. Cl.
CPC .............. *H03B 5/04* (2013.01); *G01R 23/02* (2013.01); *H03B 5/08* (2013.01); *H03B 5/32* (2013.01); *H03L 1/022* (2013.01); *H03L 1/026* (2013.01)

(58) Field of Classification Search
CPC .... H03B 5/04; H03B 5/32; H03B 5/08; H03L 1/026; H03L 1/022; G01R 23/02

USPC ........................ 331/176, 158, 116 FE, 177 V
See application file for complete search history.

(56) References Cited

U.S. PATENT DOCUMENTS

| | | | | | |
|---|---|---|---|---|---|
| 5,719,782 | A | * | 2/1998 | Mitsuoka | ............... G01R 23/10 331/158 |
| 5,777,524 | A | * | 7/1998 | Wojewoda | ............... H04B 1/40 455/75 |

FOREIGN PATENT DOCUMENTS

| | | | |
|---|---|---|---|
| JP | H08-139593 | A | 5/1996 |
| JP | 2016-178607 | A | 10/2016 |

* cited by examiner

*Primary Examiner* — Arnold M Kinkead
(74) *Attorney, Agent, or Firm* — Harness, Dickey & Pierce, P.L.C.

(57) ABSTRACT

A circuit apparatus includes an oscillation control circuit configured to control oscillation of a resonator, a measurement unit configured to measure information corresponding to a frequency of an oscillation signal output from the oscillation control circuit, and an interface, and is configured such that, when a first signal that determines a measurement period received from outside, the measurement unit measures the information corresponding to the frequency of the oscillation signal output during the measurement period, and the interface outputs a measurement result of the information corresponding to the frequency.

20 Claims, 6 Drawing Sheets

*FIG. 5*

| MEASUREMENT CONDITION | ZEROTH ORDER | FIRST ORDER | SECOND ORDER | THIRD ORDER |
|---|---|---|---|---|
| C1 | — | — | — | — |
| C2 | MAXIMUM | — | — | — |
| C3 | MINIMUM | — | — | — |
| C4 | — | MAXIMUM | — | — |
| C5 | — | MINIMUM | — | — |
| C6 | — | — | MAXIMUM | — |
| C7 | — | — | MINIMUM | — |
| C8 | — | — | — | MAXIMUM |
| C9 | — | — | — | MINIMUM |

CIRCUIT APPARATUS AND OSCILLATOR

The present application is based on, and claims priority from JP Application Serial Number 2023-205932, filed Dec. 6, 2023, the disclosure of which is hereby incorporated by reference herein in its entirety.

BACKGROUND

1. Technical Field

The present disclosure relates to a circuit apparatus and an oscillator.

2. Related Art

In related art, a technique for measuring a frequency of an oscillator is known. The measured frequency is used, for example, to generate temperature compensation data for bringing a plurality of order components of frequency-temperature characteristics close to 0, as disclosed in JP-A-2016-178607.

JP-A-2016-178607 is an example of the related art.

In the related art, it is necessary to obtain a frequency by measuring an oscillation signal output from an oscillator outside the oscillator. In the case of such a configuration, work for measuring frequencies of a plurality of oscillators is fairly complicated and time-consuming.

SUMMARY

A circuit apparatus according to an embodiment includes: an oscillation control circuit configured to control oscillation of a resonator; a measurement unit configured to measure information corresponding to a frequency of an oscillation signal output from the oscillation control circuit; and an interface, in which, when a first signal that determines a measurement period is received from outside, the measurement unit measures the information corresponding to the frequency of the oscillation signal output during the measurement period, and the interface outputs a measurement result of the information corresponding to the frequency.

An oscillator according to an embodiment includes: a resonator; an oscillation control circuit configured to control oscillation of the resonator; a measurement unit configured to measure information corresponding to a frequency of an oscillation signal output from the oscillation control circuit; and an interface, in which, when a first signal that determines a measurement period is received from outside, the measurement unit measures the information corresponding to the frequency output during the measurement period, and the interface outputs a measurement result of the information corresponding to the frequency.

BRIEF DESCRIPTION OF THE DRAWINGS

FIG. 5 shows a timing chart showing a voltage waveform of a terminal related to mode setting.

DESCRIPTION OF EMBODIMENTS

Here, an embodiment of the disclosure will be described according to the following order.

(1) Configuration of Oscillator:
(2) Frequency Adjustment Processing:
(3) Other Embodiments:

(1) Configuration of Oscillator

Hereinafter, an embodiment of the disclosure will be described in detail with reference to the drawings. The embodiment to be described below does not unduly limit contents of the disclosure described in the claims. Not all configurations described below are necessarily essential elements of the disclosure.

Figure 1:
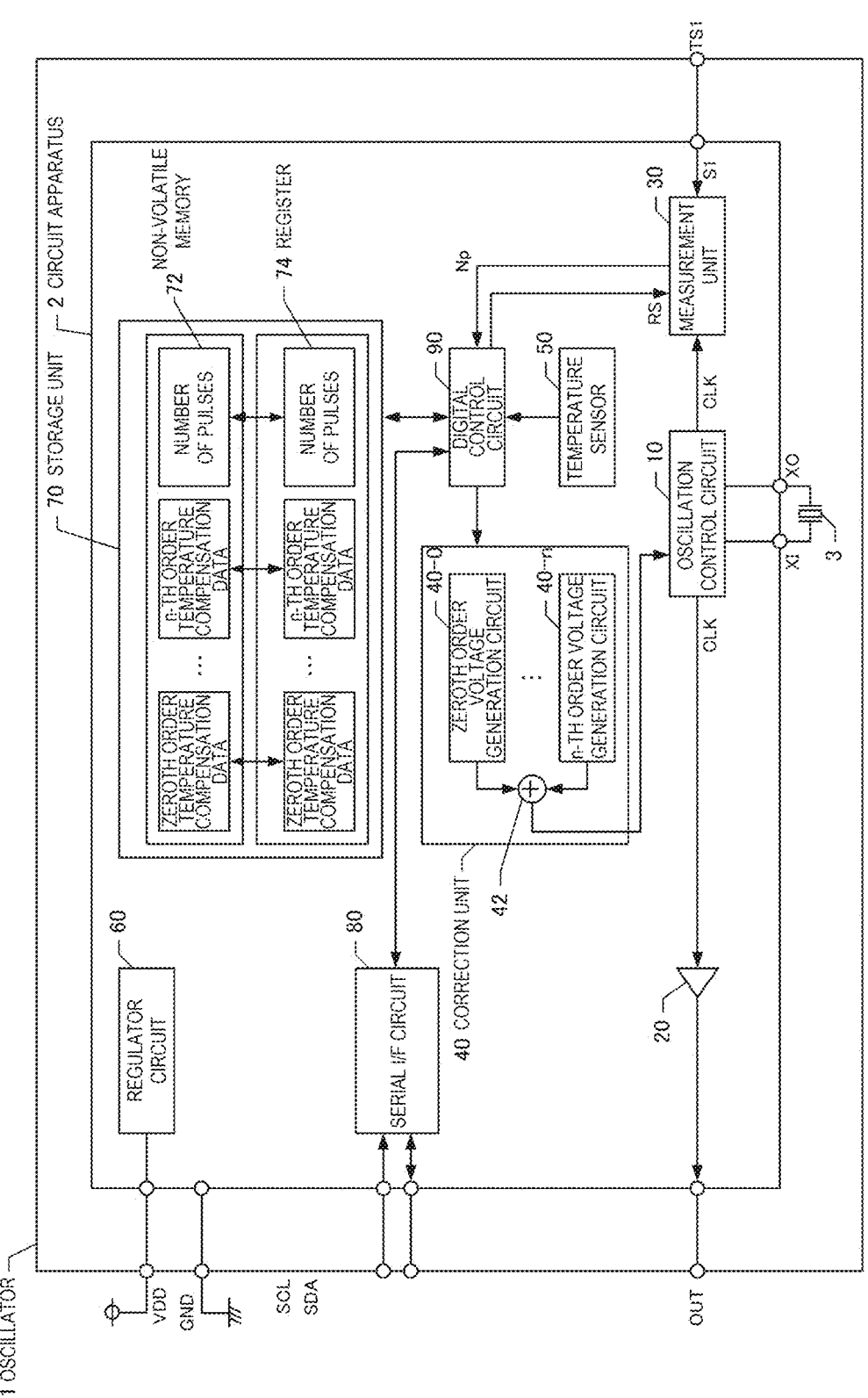
FIG. 1 is a configuration diagram of an oscillator according to an embodiment of the disclosure.

FIG. 1 is a functional block diagram of an oscillator 1. The oscillator 1 according to the present embodiment is accommodated in a package (not shown) and includes a circuit apparatus 2 and a resonator 3. External terminals are formed at an outer surface of the package. Each external terminal is electrically connected to a corresponding terminal formed at the circuit apparatus 2. In the present embodiment, the terminals include a power supply terminal VDD, a ground terminal GND, a terminal TS1 to which a first signal for determining a frequency measurement period is input, terminals SCL and SDA for serial communication, and an output terminal OUT. In the present embodiment, the terminal TS1 that is an input terminal for receiving the first signal is provided at the oscillator 1 separately from the terminals SCL and SDA for serial communication, and alternatively, these terminals may be a common terminal.

As the resonator 3, for example, a quartz crystal resonator, a surface acoustic wave (SAW) resonator, another piezoelectric resonator, or a micro electro mechanical systems (MEMS) resonator may be used. As a substrate material of the resonator 3, a piezoelectric material such as a piezoelectric single crystal such as quartz crystal, lithium tantalate, or lithium niobate, a piezoelectric ceramic such as lead zirconate titanate, or a silicon semiconductor material can be used. As an excitation method of the resonator 3, a method based on a piezoelectric effect may be used, or an electrostatic drive using a Coulomb force may be used. The circuit apparatus 2 and the resonator 3 are electrically connected via an XO terminal and an XI terminal.

In the present embodiment, the circuit apparatus 2 includes an oscillation control circuit 10, an output circuit 20, a measurement unit 30, a correction unit 40, a temperature sensor 50, a regulator circuit 60, a storage unit 70, a serial interface (I/F) circuit 80, and a digital control circuit 90. The circuit apparatus 2 in the present embodiment may have a configuration in which a part of these elements is omitted or changed, or another element is added.

Based on a power supply voltage supplied from the VDD terminal, the regulator circuit 60 generates a constant voltage that is a power supply voltage or a reference voltage of a part or all of the oscillation control circuit 10, the output circuit 20, the measurement unit 30, the correction unit 40, the digital control circuit 90, and the like. The serial interface circuit 80 is a circuit that is an interface for communication between an external apparatus and the oscillator 1. In the present embodiment, the serial interface circuit 80 is a circuit that performs I2C communication, and of course, the communication method is not limited to the I2C method.

The storage unit 70 includes a non-volatile memory 72 and a register 74. The register 74 can store information transmitted by the external apparatus via the terminal SDA and the serial interface circuit 80. The register 74 can also output information stored in the register 74 to the external apparatus via the terminal SDA and the serial interface circuit 80.

The non-volatile memory 72 is a storage unit for storing various types of control data, and may be, for example, various rewritable non-volatile memories such as an electrically erasable programmable read-only memory (EE-PROM) or a flash memory, or various non-rewritable non-volatile memories such as a one time programmable read only memory (one-time PROM). The digital control circuit 90 can store the information stored in the register 74 in the non-volatile memory 72 and store the information stored in the non-volatile memory 72 in the register 74.

In the present embodiment, the non-volatile memory 72 stores temperature compensation data (zeroth order temperature compensation data, . . . , n-th order temperature compensation data) for controlling the correction unit 40 that corrects a temperature characteristic of the resonator 3. Since the zeroth order temperature compensation data is data independent of a temperature, a frequency at a reference temperature is adjusted by the zeroth order temperature compensation data. Here, n is a positive integer value. Further, data for controlling the output circuit 20 and the like may be stored in the non-volatile memory 72.

The temperature compensation data (zeroth order temperature compensation data, . . . , n-th order temperature compensation data) is data calculated in temperature compensation adjustment processing of the oscillator 1 for correcting frequency-temperature characteristics of the oscillator 1, and is, for example, a value for causing the correction unit 40 to output a voltage corresponding to each of zeroth order to n-th order components of the frequency-temperature characteristics of an oscillation signal CLK. For example, if the resonator 3 is an AT cut quartz crystal resonator, the frequency-temperature characteristics follow a cubic curve, and thus an integer value of 3 or more is selected as n. The temperature compensation data may include compensation data of all of the zeroth to n-th orders or may include only compensation data of a part of the zeroth to n-th orders.

Various types of data including the temperature compensation data stored in the non-volatile memory 72 are transferred from the non-volatile memory 72 to the register 74 when the circuit apparatus 2 is powered on (when a voltage of the VDD terminal rises from 0 V to a desired voltage), and are retained in the register 74. The temperature compensation data . . . , (the zeroth order temperature compensation data, the n-th order temperature compensation data) retained in the register 74 is input to the correction unit 40.

When a frequency of the oscillation signal CLK of the oscillator 1 is measured, the number of pulses, which is information corresponding to the frequency, is written to the register 74. Data written in the register 74 is written to the non-volatile memory 72. When reading from the external apparatus is performed, the number of pulses is output to the external apparatus via the terminal SDA and the serial interface circuit 80.

The oscillation control circuit 10 is a circuit that controls oscillation of the resonator 3. Specifically, the oscillation control circuit 10 amplifies an output signal of the resonator 3 and feeds back the amplified signal to the resonator 3, thus the resonator 3 is caused to oscillate, and the oscillation signal CLK based on the oscillation of the resonator 3 is output. In the present embodiment, the oscillation control circuit 10 includes a variable capacitance element for temperature adjustment. By changing a voltage applied to the variable capacitance element, the frequency of the oscillation signal CLK output from the oscillation control circuit 10 can be changed. An output voltage of the correction unit 40 is configured to be applied to the variable capacitance element, and by applying, to the variable capacitance element, a voltage that counteracts a change in the frequency of the oscillation signal CLK due to a temperature, temperature compensation is performed such that the frequency does not change relative to a temperature change in a predetermined range.

The temperature sensor 50 is a temperature sensing element that outputs a signal corresponding to a temperature in the vicinity thereof (for example, a voltage corresponding to the temperature). The temperature sensor 50 may have a positive polarity such that an output voltage increases as the temperature increases, or may have a negative polarity such that the output voltage decreases as the temperature increases. It is desirable that the temperature sensor 50 causes the output voltage to change as linearly as possible relative to a temperature change in a desired temperature range in which an operation of the oscillator 1 is guaranteed. In the present embodiment, the output voltage corresponding to the temperature detected by the temperature sensor 50 is input to the digital control circuit 90 via an analog-digital conversion circuit (not shown).

The digital control circuit 90 is a processor that executes various types of digital processing. The various types of digital processing include control processing on the correction unit 40 and processing for measuring the frequency of the oscillation signal CLK.

In the control processing on the correction unit 40, the digital control circuit 90 outputs a control signal for instructing a zeroth order temperature compensation voltage to an n-th order temperature compensation voltage based on the zeroth order temperature compensation data to the n-th order temperature compensation data stored in the register 74. The correction unit 40 generates a voltage for compensating for the frequency-temperature characteristics of the resonator 3 (temperature compensation voltage) based on the control signal from the digital control circuit 90 and applies the voltage to one end of a variable capacitance element (not shown) that functions as a load capacitor of the oscillation control circuit 10. Accordingly, an oscillation frequency of the oscillation control circuit 10 is controlled to be substantially constant regardless of the temperature. In the present embodiment, the correction unit 40 includes a zeroth order voltage generation circuit 40-0 to an n-th order voltage generation circuit 40-n, and a summing circuit 42.

Each of the zeroth order voltage generation circuit 40-0 to the n-th order voltage generation circuit 40-n generates, according to the control signal from the digital control circuit 90, a zeroth order temperature compensation to an n-th order temperature compensation voltage for compensating for a zeroth order component to an n-th order component of the frequency-temperature characteristics of the resonator 3. The summing circuit 42 sums up the zeroth order temperature compensation voltage to the n-th order temperature compensation voltage generated by the zeroth order voltage generation circuit 40-0 to the n-th order voltage generation circuit 40-n, respectively, and outputs the summed up voltage. The output voltage of the summing circuit 42 is the output voltage (temperature compensation voltage) of the correction unit 40.

The output circuit 20 receives the oscillation signal CLK output from the oscillation control circuit 10, generates the oscillation signal CLK for output to the outside, and outputs the oscillation signal CLK to the outside via the OUT terminal. For example, a division ratio or an output level of the oscillation signal CLK of the output circuit 20 may be controlled based on the control data retained in the register 74.

The oscillator 1 configured as described above functions as a voltage controlled temperature compensated oscillator (a voltage controlled temperature compensated crystal oscillator (VC-TCXO) if the resonator 3 is a quartz crystal resonator) that outputs the oscillation signal CLK of a constant frequency regardless of the temperature in the desired temperature range.

Figure 2:
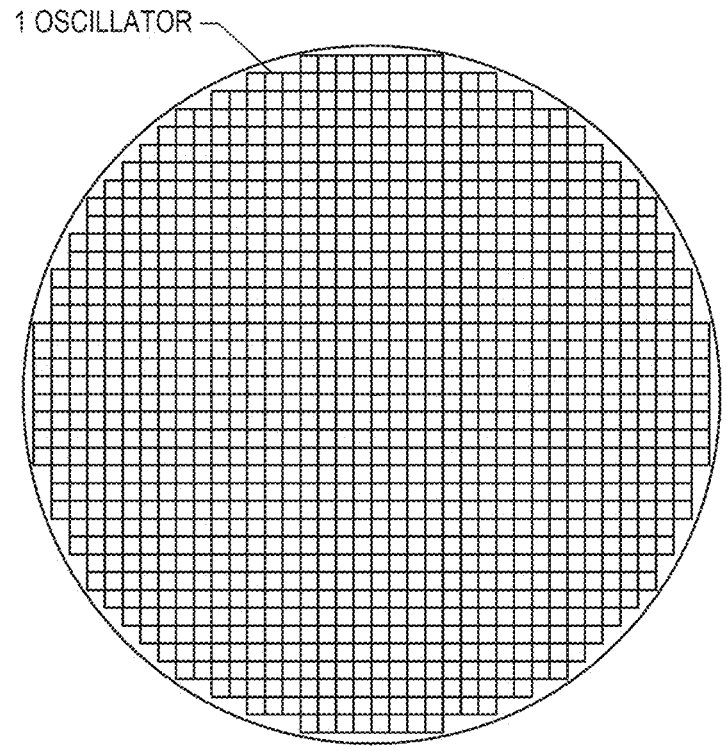
FIG. 2 shows a wafer where the oscillator is formed.

In a manufacturing process of the oscillator 1, a large number of oscillators 1 having the same configuration are generally manufactured in parallel. FIG. 2 schematically shows a state where a plurality of oscillators 1 are formed at a wafer in an undiced state. In the present embodiment, it is assumed that a temperature characteristic of the oscillation signal CLK of each oscillator 1 is measured in this state and the temperature compensation data is generated for each oscillator 1. FIG. 2 schematically shows the plurality of oscillators 1 formed at the wafer, and the number of oscillators 1 is not limited. A size of a largest surface of the oscillator 1 is, for example, 1 mm×0.8 mm, and in an actual manufacturing process, tens of thousands of oscillators 1 may be formed at one surface of a wafer.

In such a configuration, when the oscillation signal CLK is output from the oscillator 1 and the frequency of the oscillation signal CLK of each oscillator 1 is measured by the external apparatus, it is difficult to simultaneously measure frequencies of oscillation signals CLK of all the oscillators 1. For example, in order to simultaneously measure the oscillation signals CLK output from each of the tens of thousands of oscillators 1, tens of thousands of frequency counters are required outside the oscillators 1, which is practically unfeasible.

Therefore, in the present embodiment, a circuit for measuring information corresponding to a frequency is provided inside the oscillator 1, the information corresponding to the frequency is output from the oscillator 1 to the external apparatus, and the frequency is calculated by the external apparatus. That is, if information corresponding to tens of thousands of frequencies is processed as digital data, the processing can be easily executed by a general-purpose computer or the like, and it is possible to simultaneously measure frequencies of even tens of thousands of oscillators 1.

In order to implement such frequency measurement, the circuit apparatus 2 in the oscillator 1 according to the present embodiment includes the measurement unit 30. The measurement unit 30 is a circuit that measures the information corresponding to the frequency of the oscillation signal CLK output from the oscillation control circuit 10. In the present embodiment, the measurement unit 30 is implemented by a counter. In the present embodiment, the information corresponding to the frequency of the oscillation signal CLK is a number of pulses Np of the oscillation signal CLK.

The measurement unit 30 is a counter that counts the number of pulses of the oscillation signal CLK, and for example, can be implemented by a known circuit in which frequency divider circuits are connected in series. The number of connections of the frequency divider circuit may be any number necessary for representing the number of bits indicating a count value. The oscillation signal CLK and a first signal S1 input from the terminal TS1 are input to the measurement unit 30. In the present embodiment, the first signal S1 is a signal with a pulse width having a length indicating duration of a measurement period. When the first signal S1 that determines the measurement period of the oscillation signal CLK is received from the outside via the terminal TS1, the measurement unit 30 counts the number of pulses Np of the oscillation signal CLK output during the measurement period.

That is, the measurement unit 30 includes a circuit in which the oscillation signal CLK is input to the frequency divider circuit during a period when the first signal S1 is input to the measurement unit 30 (high level period) and the oscillation signal CLK is not input to the frequency divider circuit during a period when the first signal S1 is not input to the measurement unit 30. Such a circuit can be implemented by various known configurations. Each frequency divider circuit provided at the measurement unit 30 is configured to reset the count value to 0 based on a reset signal RS. An output of each frequency divider circuit has a bit value indicating the count value.

Figure 3:
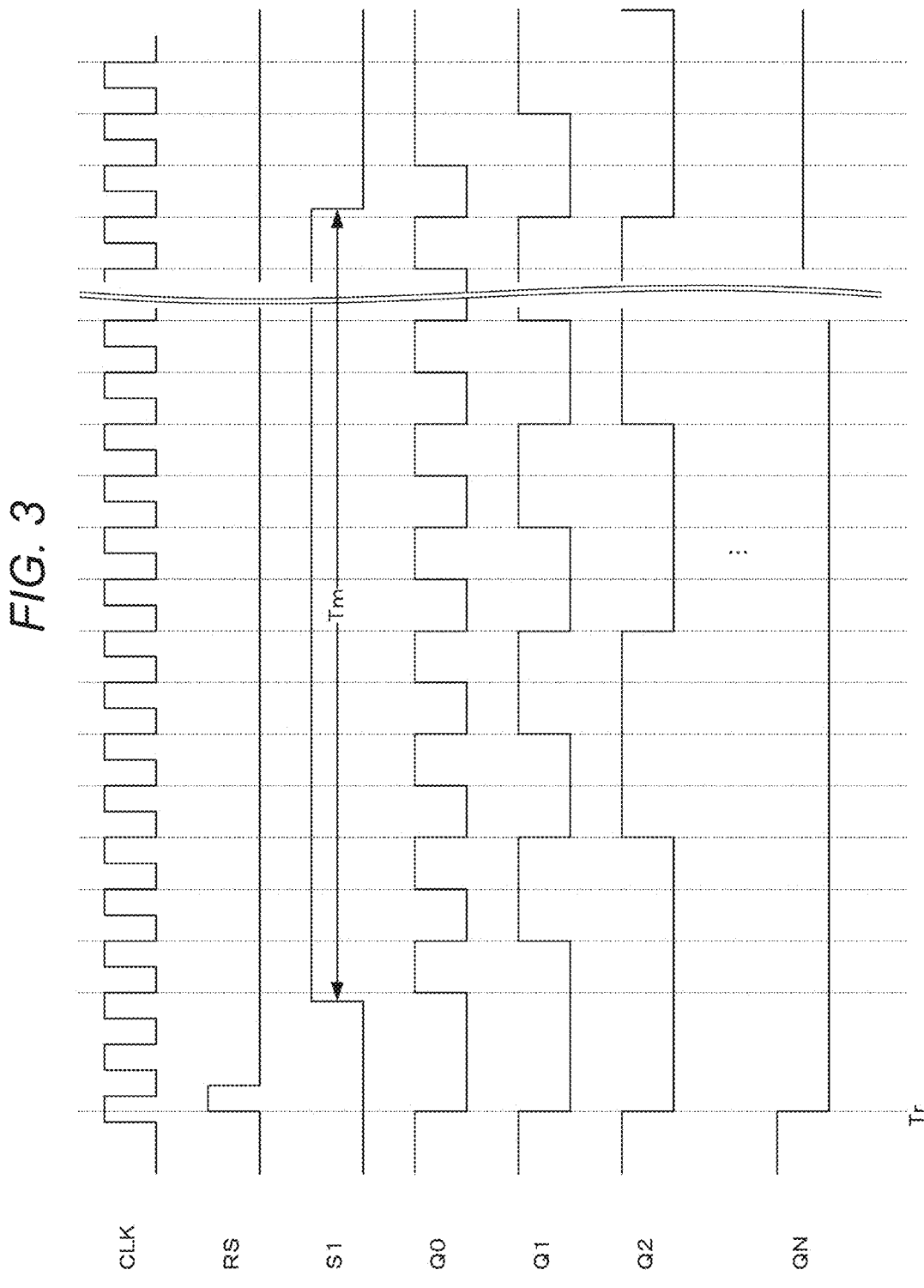
FIG. 3 shows a timing chart showing an operation of a measurement unit.

FIG. 3 is a timing chart showing an example of an input signal and an output signal of the measurement unit 30. The oscillation signal CLK is a pulse signal that repeats a high level and a low level at a regular interval. In the present embodiment, the frequency is calculated by counting the number of pulses (the number of high levels) within a measurement period Tm indicated by the first signal S1.

To count the number of pulses, the reset signal RS is output from the digital control circuit 90 when counting is started and is input to the measurement unit 30. When the reset signal RS is input to each frequency divider circuit, an output value of each frequency divider circuit, that is, each bit value of the count value is reset to 0.

After the reset, when the first signal S1 is input to the measurement unit 30, counting by the frequency divider circuit is started. In FIG. 3, outputs of the respective frequency divider circuits are denoted by Q0 to QN. A numerical value added to Q is a natural number and corresponds to the bit of the count value. That is, in the example shown in FIG. 3, the count value is represented by a value of (N+1) digits from the value Q0 of a first bit to the value QN of an (N+1)-th bit. The value of N is not limited, and in the present embodiment, is a value of a number sufficient for counting the number of pulses Np within the measurement period Tm.

When the number of pulses Np is counted over a period when the first signal S1 is at the high level and the first signal S1 changes to the low level after a lapse of the measurement period, the digital control circuit 90 acquires the number of pulses Np from the measurement unit 30 and stores the number of pulses Np in the register 74. In the present embodiment, when the number of pulses Np is stored in the register 74, the number of pulses Np is stored in the non-volatile memory 72. According to this configuration, even when the oscillator 1 is powered off, the measured number of pulses Np is retained in the storage unit 70, and the number of pulses Np can be read when powered on again.

When the number of pulses Np is stored in the register 74 and the non-volatile memory 72, a user can connect the external apparatus to the oscillator 1, read the number of pulses Np at any timing, and store the number of pulses Np in the external apparatus. In the present embodiment, the external apparatus can be implemented by a general-purpose computer, for example. The user can connect the external apparatus to the terminals SCL and SDA formed at each of the plurality of oscillators 1 formed at the wafer, and read the number of pulses Np measured for each of the plurality of oscillators 1 by one external apparatus.

That is, in response to an output instruction from the external apparatus, the digital control circuit 90 acquires the number of pulses Np stored in the register 74 and outputs the number of pulses Np to the external apparatus via the terminal SDA and the serial interface circuit 80. According to the above configuration, the frequencies of the oscillation signals CLK of the plurality of oscillators 1 can be measured fairly easily by calculating, in the external apparatus, the frequencies of the oscillation signals CLK of the plurality of oscillators 1.

(2) Frequency Adjustment Processing

Figure 4:
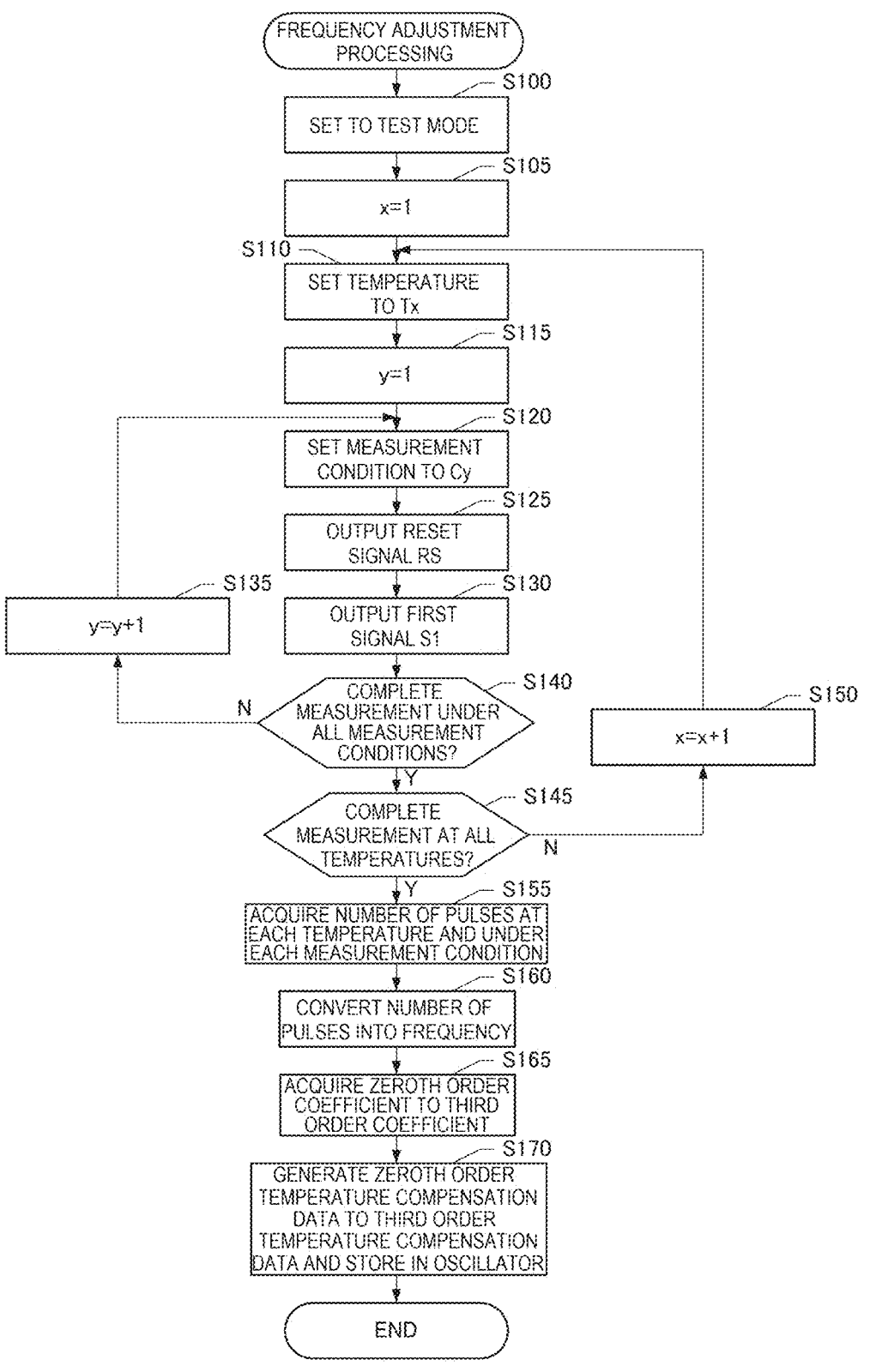
FIG. 4 is a flowchart of frequency adjustment processing.

When the oscillator 1 as described above is used, the frequencies of the oscillation signals CLK of the plurality of oscillators 1 are measured in parallel, and a temperature characteristic of each resonator 3 provided at the oscillator 1 can be corrected based on a measurement result. FIG. 4 is a flowchart showing frequency adjustment processing. Before executing the frequency adjustment processing, the user connects the plurality of oscillators 1 formed at the wafer to the external apparatus. Further, the user prepares a temperature adjustment apparatus for adjusting the plurality of oscillators 1 formed at the wafer to a desired temperature, and a temperature sensor for measuring the temperature of the plurality of oscillators 1. The user starts the frequency adjustment processing in this state.

The oscillator 1 according to the present embodiment has a normal mode and a test mode. The normal mode is a mode in which the oscillation signal CLK or a signal generated based on the oscillation signal CLK is output from the OUT terminal of the oscillator 1. The test mode is a mode for measuring the frequency and the like. When the test mode is instructed from the external apparatus, the measurement unit 30 of each oscillator 1 measures the number of pulses Np, which is information corresponding to the frequency.

Figure 5:
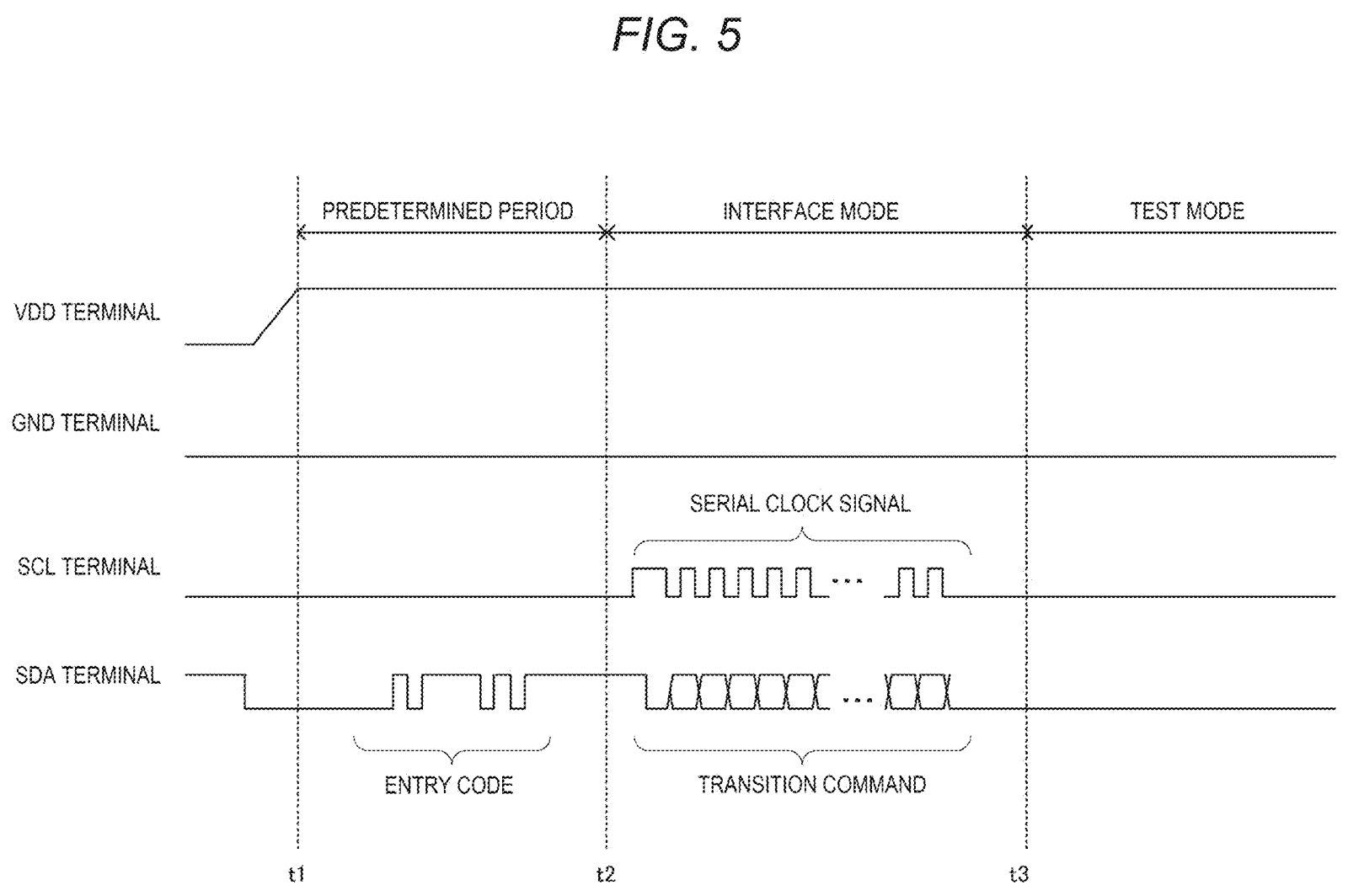

Therefore, first, the external apparatus sets the oscillator 1 to the test mode (step S100). Transition to the test mode is performed by, for example, a procedure shown in FIG. 5. FIG. 5 is an example of a timing chart showing a voltage waveform of a terminal related to mode setting. When the oscillator 1 is used, the power supply voltage is first supplied to the VDD terminal of the oscillator 1, and the GND terminal is at a ground level. In the example shown in FIG. 5, a voltage of the VDD terminal rises from a 0 level to a predetermined level, and at time t1, the voltage of the VDD terminal becomes the power supply voltage. At this time, the digital control circuit 90 transfers and stores various types of information stored in the non-volatile memory 72 into the register 74.

In a predetermined period after the time t1, the digital control circuit 90 enters a state where an entry code can be received. In the predetermined period, when no entry code having a predetermined voltage waveform is input to the SDA terminal, the digital control circuit 90 starts an operation in the normal mode. In the predetermined period, when the entry code having the predetermined voltage waveform is input to the SDA terminal, the digital control circuit 90 starts an operation in an interface mode. The interface mode is a mode in which communication using the serial interface circuit 80 is enabled, and in the present embodiment, a configuration that enables I2C communication is assumed.

In the example shown in FIG. 5, the operation in the interface mode is started at time t2. In the interface mode, the SCL terminal is used as a serial clock terminal, and the SDA terminal is used as a serial data terminal. Therefore, in the interface mode, a serial clock signal is supplied to the SCL terminal. Various commands synchronized with the serial clock signal are supplied to the SDA terminal. The digital control circuit 90 can perform various operations according to the commands. In the present embodiment, the commands include a transition command instructing the transition to the test mode. The command may be in various forms, and in the present embodiment, it is assumed that the transition to the test mode is performed when a predetermined numerical value is written to a predetermined address in the register 74. Accordingly, a command for writing the predetermined numerical value to the predetermined address is the transition command.

When the transition command is input to the SDA terminal, the digital control circuit 90 starts the test mode. In the test mode, for example, upon receiving a command to read information at an address where the number of pulses Np is stored, the digital control circuit 90 outputs the number of pulses Np to the external apparatus via the serial interface circuit 80. As described above, in the present embodiment, when the command related to the test mode, that is, the entry code and the transition command are received from the external apparatus, the transition from the normal mode to the test mode is performed.

In a state where the test mode is being performed, the external apparatus initializes a variable x for specifying the temperature to 1 (step S105). In the present embodiment, the frequency of the oscillation signal CLK is measured at a plurality of temperatures. The variable x is a value for specifying any of the plurality of temperatures. For example, when measurement temperatures are 0° C., 25° C., 50° C., and 95° C., when x is 1, 2, 3, and 4, a temperature Tx refers to each of 0° C., 25° C., 50° C., and 95° C.

Next, the external apparatus sets the temperature to Tx (step S110). That is, the external apparatus can control the temperature adjustment apparatus for adjusting the temperature of the oscillator 1 formed at the wafer and can acquire a detection result of the temperature sensor. The external apparatus controls the temperature adjustment apparatus based on the detection result of the temperature sensor and sets the temperature of each oscillator 1 to Tx.

When the temperature of each oscillator 1 formed at the wafer becomes Tx, the external apparatus initializes a variable y for specifying a measurement condition to 1 (step S115). In the present embodiment, the frequency is measured under a plurality of measurement conditions at the same temperature, and the variable y is a value for specifying any of the measurement conditions.

A measurement condition Cy corresponds to a state of correction of the correction unit 40, and when the measurement condition Cy differs, presence or absence of temperature compensation data application by the correction unit 40 and a degree of correction differ. Specifically, when the measurement condition Cy differs, whether a voltage is applied, by the zeroth order voltage generation circuit 40-0 to the n-th order voltage generation circuit 40-n, to the variable capacitance element of the oscillation control circuit 10 differs, and when the voltage is applied, a magnitude thereof differs.

Figures 6, 7:
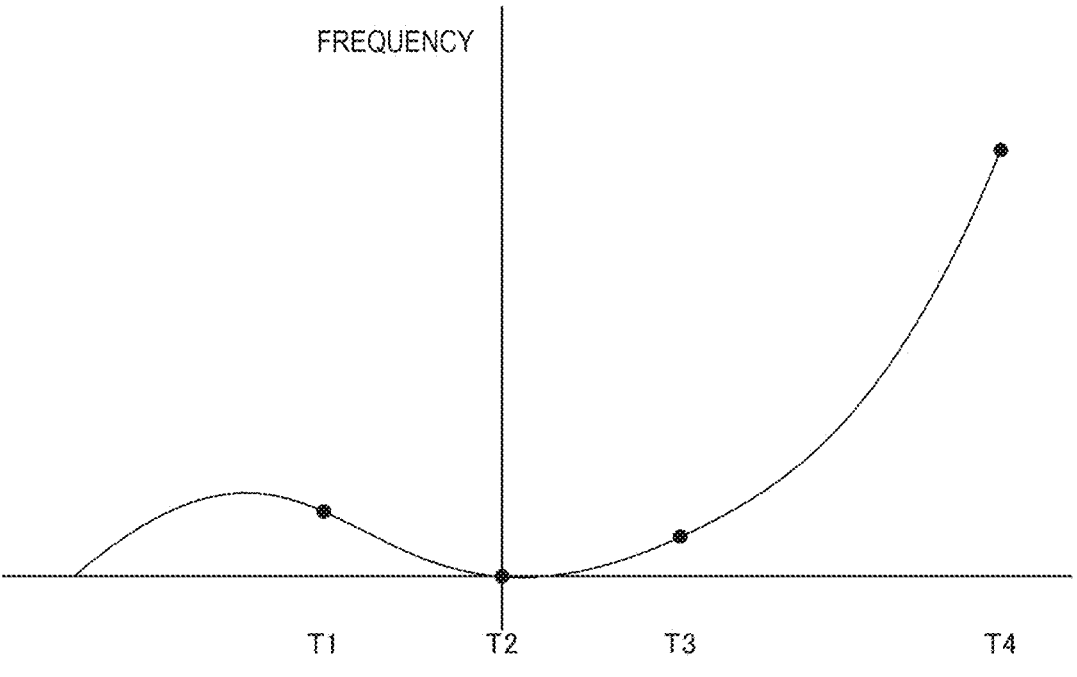
FIG. 6 shows a measurement condition.
FIG. 7 shows a temperature characteristic of a frequency of the oscillator.

FIG. 6 shows an example of the measurement condition Cy. In FIG. 6, an example is assumed in which the correction unit 40 includes the zeroth order voltage generation circuit 40-0 to a third order voltage generation circuit 40-3. Zeroth to third orders shown in FIG. 6 indicate presence or absence of correction and a magnitude of correction in the zeroth order voltage generation circuit 40-0 to the third order voltage generation circuit 40-3.

For example, correction is not performed for an order shown by "-" in FIG. 6. Accordingly, in the case of a measurement condition C1, no correction is performed in the zeroth order voltage generation circuit 40-0 to the third order voltage generation circuit 40-3. In this case, the number of pulses Np is the number of pulses Np within the measurement period Tm when the oscillator 1 becomes the temperature Tx without correction. FIG. 6 shows that, for an order shown as "maximum", correction is performed with a maximum value of a voltage that can be output by a voltage generation circuit of the order. For example, in the case of a measurement condition C2, a maximum value of a voltage that can be output in the zeroth order voltage generation circuit 40-0 is output, and correction is not performed in the first order voltage generation circuit 40-1 to the third order voltage generation circuit 40-3.

FIG. 6 shows that, for an order shown as "minimum", correction is performed with a minimum value of a voltage that can be output by a voltage generation circuit of the order. For example, in the case of a measurement condition C5, a minimum value of a voltage that can be output in the first order voltage generation circuit 40-1 is output, and correction is not performed in the zeroth order voltage generation circuit 40-0, the second order voltage generation circuit 40-2, and the third order voltage generation circuit 40-3. As described above, in the present embodiment, a condition under which no correction is performed for any of the zeroth order voltage generation circuit 40-0 to the third order voltage generation circuit 40-3, a condition under which only one of the circuits is corrected with the maximum value of the voltage, and a condition under which only one of the circuits is corrected with the minimum value of the voltage are defined, and a total of nine measurement conditions Cy are defined, that is, the measurement condition C1 to a measurement condition C9. Hereinafter, the frequency adjustment processing will be described with reference to the example shown in FIG. 6.

In step S120, the external apparatus sets the measurement condition to Cy (step S120). Specifically, the external apparatus outputs a command for operating the correction unit 40 according to presence or absence and a magnitude of correction corresponding to the measurement condition Cy. The digital control circuit 90 acquires the command via the SDA terminal and the serial interface circuit 80, and controls the correction unit 40 based on the command to control the presence or absence and the magnitude of correction corresponding to the measurement condition Cy. That is, the digital control circuit 90 instructs the correction unit 40 to perform correction with the temperature compensation data corresponding to the measurement condition Cy based on the command, and the correction unit 40 operates the zeroth order voltage generation circuit 40-0 to the n-th order voltage generation circuit 40-$n$ to operate with the instructed temperature compensation data. According to the above configuration, measurement by the measurement unit 30 can be performed in a state where the correction by the correction unit 40 is performed according to the measurement condition Cy.

Next, the external apparatus causes the digital control circuit 90 to output the reset signal RS (step S125). Specifically, the external apparatus outputs, to the oscillator 1, a command for outputting the reset signal RS. The digital control circuit 90 acquires the command via the SDA terminal and the serial interface circuit 80, and outputs the reset signal RS to the measurement unit 30. As a result, the reset signal RS is output as shown at time Tr in FIG. 3, and a total output of the frequency divider circuit provided at the measurement unit 30 is at a low level (0).

Next, the external apparatus outputs the first signal S1 (step S130). Specifically, the external apparatus outputs the first signal S1 having a pulse width of a predetermined duration to the oscillator 1. The first signal S1 is supplied to the measurement unit 30 via the terminal TS1. As a result, as in the example shown in FIG. 3, when the first signal S1 changes from a low level to a high level, measurement by the measurement unit 30 is started. The frequency divider circuit of the measurement unit 30 transmits a signal to a subsequent stage each time a falling edge of the oscillation signal CLK occurs, and as a result, Q0 to QN indicate the number of falling edges of the oscillation signal CLK occurring after the first signal S1 is input, that is, the number of pulses, in a two-bit manner.

The duration of the first signal S1 has a predetermined length, and when the first signal S1 changes from the high level to the low level, the number of pulses Np is acquired by the digital control circuit 90 and stored at the predetermined address in the register 74. The number of pulses Np stored in the register 74 is stored in the non-volatile memory 72. The above processing is executed for each of the plurality of oscillators 1 connected to the external apparatus. That is, the number of pulses Np, which is the measurement result under the measurement condition Cy at the same temperature Tx, is acquired in each oscillator 1 and stored in the register and the non-volatile memory 72 of each oscillator 1.

In the present embodiment, the pulse width of the first signal S1, that is, the measurement period Tm is accurately determined based on an internal clock of a known frequency in the external apparatus. Accordingly, in the present embodiment, it is possible to accurately specify the frequency based on the number of pulses Np and the measurement period Tm. Before the measurement by the test mode, the frequency of the oscillator 1 is not accurately specified, and thus it is difficult to accurately specify the frequency of the oscillation signal CLK using a signal inside the oscillator 1. However, in the present embodiment, since the measurement period Tm accurately determined by the external apparatus is used, it is easy to accurately measure the frequency of the oscillation signal CLK.

Next, the external apparatus determines whether measurement is completed under all measurement conditions (step S140). When it is not determined in step S140 that the measurement is completed under all measurement conditions, the external apparatus increments the variable y (step S135) and repeats the processing of step S120 and the subsequent steps. According to the above configuration, the number of pulses Np corresponding to the frequency of the oscillation signal CLK is measured under each measurement condition. That is, the measurement unit 30 measures the number of pulses Np for each of the measurement condition C1 to the measurement condition C9 at the temperature Tx. The digital control circuit 90 stores the measurement result at the predetermined address in the register 74 and the non-volatile memory 72. In the present embodiment, the address where the measurement result at each temperature and under each measurement condition is stored is determined in advance, and the external apparatus can acquire the measurement result at any temperature and under any measurement condition by specifying a reading target address.

When it is determined in step S140 that the measurement is completed under all measurement conditions, the external apparatus determines whether the measurement is completed at all temperatures (step S145). When it is not determined in step S145 that the measurement is completed at all temperatures, the external apparatus increments the variable x (step S150) and repeats the processing of step S110 and the subsequent steps.

When it is determined in step S145 that the measurement is completed at all temperatures, the external apparatus acquires the number of pulses Np at each temperature and under each measurement condition (step S155). Since the number of pulses Np at each temperature and under each measurement condition is stored at the predetermined address in the register 74 of the oscillator 1, the external apparatus reads the number of pulses Np by specifying the address. The digital control circuit 90 of the oscillator 1 acquires the number of pulses Np stored at the reading target address and outputs the number of pulses Np to the external apparatus via the serial interface circuit 80. The read number of pulses Np is stored in a storage medium (not shown) of the external apparatus in association with the temperature and the measurement condition. The external apparatus obtains the number of pulses Np at all temperatures and under all measurement conditions for all of the plurality of oscillators 1.

Next, the external apparatus converts the number of pulses into the frequency (step S160). Specifically, the external apparatus obtains the frequency by dividing the number of pulses Np by the measurement period Tm. Here, the external apparatus obtains the frequency at all temperatures and under all measurement conditions for all of the plurality of oscillators 1.

Next, the external apparatus obtains a zeroth order coefficient to a third order coefficient (step S165). Specifically, in this example, a relationship between the frequency of the oscillation signal CLK and the temperature is regarded as being expressed by a cubic equation. Therefore, the external apparatus regards a frequency F as being expressed by a function of a temperature T as in equation (1).

$$F = aT^3 + bT^2 + cT + d \qquad (1)$$

Here, a, b, c, and d are a third order coefficient, a second order coefficient, a first order coefficient, and a zeroth order coefficient, respectively.

The external apparatus acquires a cubic equation approximating the relationship between the frequency and the temperature based on the frequency obtained based on the number of pulses Np measured under each measurement condition and the temperature. FIG. 7 is a graph plotting frequencies at temperatures T1 to T4 under the measurement condition C1. In the graph shown in FIG. 7, a horizontal axis represents the temperature and a vertical axis represents the frequency. The measurement condition C1 is a temperature characteristic of the frequency of the oscillation signal CLK in a state where the correction by the correction unit 40 is not performed. Therefore, by using the frequency at each of the four temperatures measured under the measurement condition C1, the cubic equation can be specified using a known approximation and can be regarded as the temperature characteristic of the frequency of the oscillation signal CLK.

When the coefficients of the cubic equation obtained by the approximation are expressed as $a_1$, $b_1$, $c_1$, and $d_1$, the cubic equation of the frequency F is expressed as equation (2).

$$F = a_1T^3 + b_1T^2 + c_1T + d_1 \qquad (2)$$

A solid line shown in FIG. 7 shows a result of plotting the equation (2) on the graph.

Since the frequency of the oscillation signal CLK has the temperature characteristic as in equation (2) under the measurement condition C1, the temperature characteristic in equation (2) can be canceled out if an inverse characteristic of the characteristic, that is, a characteristic expressed as in equation (3) can be provided to the oscillation control circuit 10 by the correction unit 40.

$$F = -a_1T^3 - b_1T^2 - c_1T - d_1 \qquad (3)$$

The external apparatus determines a correction coefficient for performing cancellation as described above. That is, the external apparatus considers that, in equation (3) specified based on the measurement result under the measurement condition C1, $-d_1$ is the zeroth order coefficient, $-c_1$ is the first order coefficient, $-b_1$ is the second order coefficient, and $-a_1$ is the third order coefficient. The external apparatus obtains the zeroth order coefficient to the third order coefficient for all of the plurality of oscillators 1.

Next, the external apparatus generates zeroth order temperature compensation data to third order temperature compensation data and stores such data in the oscillator 1 (step S170). Specifically, the external apparatus specifies a temperature compensation voltage for obtaining each of the zeroth order coefficient to the third order coefficient, and specifies the temperature compensation data for outputting the temperature compensation voltage.

Therefore, the external apparatus uses measurement results under the measurement condition C2 to the measurement condition C9 to specify the temperature compensation voltage for obtaining each of the zeroth order coefficient to the third order coefficient. Specifically, the external apparatus specifies the zeroth order temperature compensation voltage using the measurement conditions C2 and C3. A measurement result under the measurement condition C2 is a measurement result in a state where the maximum value of the voltage that can be output in the zeroth order voltage generation circuit 40-0 is output and correction is not performed in the first order voltage generation circuit 40-1 to the third order voltage generation circuit 40-3. A measurement result under the measurement condition C3 is a measurement result in a state where the minimum value of the voltage that can be output in the zeroth order voltage generation circuit 40-0 is output and correction is not performed in the first order voltage generation circuit 40-1 to the third order voltage generation circuit 40-3.

Therefore, if an approximation similar to equation (3) is performed based on the frequency obtained based on the number of pulses that is the measurement result under the measurement condition C2, it is possible to acquire a correction coefficient dmax in a state where the maximum value of the voltage that can be output in the zeroth order voltage generation circuit 40-0 is output. If an approximation similar to equation (3) is performed based on the frequency obtained based on the number of pulses that is the measurement result under the measurement condition C3, it is possible to acquire a correction coefficient dmin in a state where the minimum value of the voltage that can be output in the zeroth order voltage generation circuit 40-0 is output.

According to the correction coefficients dmax and dmin, a range of the correction coefficient that is changed by the zeroth order voltage generation circuit 40-0 can be specified. That is, it can be said that the range of the correction coefficient changed by the zeroth order voltage generation circuit 40-0 is in a range of dmin to dmax. The zeroth order temperature compensation data is a numerical value within a predetermined range, and when the zeroth order temperature compensation data is changed in the range from the maximum value to the minimum value, the correction coefficient can be changed within the range of dmax to dmin. The change in the correction coefficient relative to the change in the zeroth order temperature compensation data can be regarded as a linear change. Therefore, when "$-d_1$", which is the zeroth order coefficient, is compared with the range dmin to dmax of the correction coefficient, it is possible to specify the zeroth order temperature compensation data necessary for outputting the zeroth order temperature compensation voltage corresponding to "$-d_1$", which is the zeroth order coefficient.

The external apparatus also performs the same processing as the above processing for the first order coefficient to the third order coefficient. That is, the external apparatus specifies the first order temperature compensation data using the measurement conditions C4 and C5, specifies the second order temperature compensation data using the measurement conditions C6 and C7, and specifies the third order temperature compensation data using the measurement conditions C8 and C9.

When the zeroth order temperature compensation data to the third order temperature compensation data are acquired as described above, the external apparatus writes each piece of temperature compensation data to a predetermined address in the oscillator 1. That is, the external apparatus outputs, to the oscillator 1, a command for storing each piece of temperature compensation data at the predetermined address. The digital control circuit 90 acquires the command via the SDA terminal and the serial interface circuit 80 and stores each piece of temperature compensation data at the address instructed by the command. The external apparatus executes the above processing on all of the plurality of oscillators 1 formed at the wafer.

According to the above configuration, the frequencies of the plurality of oscillators 1 can be measured simultaneously and accurately. In a configuration in which the frequencies of the plurality of oscillators 1 are sequentially measured, measurement is performed at different timings for the oscillator 1 measured first and the oscillators 1 measured thereafter. Such a time lag increases as the number of the oscillators 1 to be measured increases. As the time lag increases, it becomes difficult to maintain the temperature at the time of measurement at the same temperature, and it becomes difficult to manage the temperature. When measuring at different temperatures, approximation processing using different temperatures is required for each oscillator 1, and the processing is complicated. However, according to the present embodiment, since it is possible to simultaneously measure the frequencies of the plurality of oscillators 1, it can be considered that temperatures of the plurality of oscillators 1 are the same, the temperature management is simple, and the approximation processing is simple. Accordingly, it is possible to easily measure the frequencies of the plurality of oscillators 1.

Further, since the oscillator 1 includes the measurement unit 30 inside the oscillator 1, it is not necessary to provide a pulse counter or a frequency measurement function for the oscillation signal CLK in the external apparatus in order to measure the frequency of the oscillator 1. Therefore, it is possible to simultaneously measure the frequencies of the plurality of oscillators 1 using a simple external apparatus.

When the frequency adjustment processing is completed, the temperature characteristic of the oscillator 1 is preferably tested. That is, the frequency of the oscillator 1 is measured at a plurality of temperatures, and it is checked whether a change in the frequency due to the temperature is equal to or less than a predetermined reference. For the oscillator 1 in which the change in the frequency due to the temperature is not equal to or less than the predetermined reference, the frequency adjustment processing shown in FIG. 4 is executed again. In the present embodiment, the temperature management of the oscillator 1 is simple and the approximation processing is simple, and thus a load when repeating execution of the frequency adjustment processing and the temperature characteristic test is fairly small as compared to the configuration in which the frequencies of the plurality of oscillators 1 are measured sequentially.

(3) Other Embodiments

The embodiment described above is an example for carrying out the disclosure, and various other embodiments can be adopted. For example, the oscillator 1 may be an oscillator including a PLL circuit. An object to which the oscillator 1 according to the embodiment of the disclosure is applied is not limited, and the oscillator 1 can be used for various objects, for example, various electronic devices or electrical components of vehicles.

It is sufficient that the oscillation control circuit can control oscillation of the resonator. That is, it is sufficient that the oscillation of the resonator can be controlled to output the oscillation signal CLK. Accordingly, the oscillation control circuit may be implemented in various forms and may include, for example, an oscillation circuit using an RC circuit or an LC circuit, a multivibrator, or a ring oscillator. The oscillation control circuit may include a PLL circuit.

It is sufficient that the measurement unit can measure information corresponding to the frequency of the oscillation signal output from the oscillation control circuit. That is, it is sufficient that the measurement unit can measure information for specifying the frequency of the oscillation signal. The information corresponding to the frequency of the oscillation signal is not limited to the number of pulses in the measurement period as in the embodiment. For example, the information corresponding to the frequency of the oscillation signal may include the measurement period, or the information corresponding to the frequency of the oscillation signal may be information indicating the frequency.

Further, it is sufficient that the measurement unit can measure the information corresponding to the frequency of the oscillation signal output during the measurement period when the first signal for determining the measurement period is input from the outside. That is, the measurement period is specified by the first signal from the outside, and the measurement unit performs measurement in the measurement period. It is sufficient that the first signal can specify the measurement period, and various configurations may be adopted in addition to the configuration in which the measurement period is specified by the pulse width. For example, the measurement period may be specified by a digital signal, the measurement period may be specified based on an external clock and the like in each unit (the measurement unit or the like) inside the circuit apparatus, and measurement may be enabled in the measurement period.

It is sufficient that the interface can at least output the measurement result of the information corresponding to the frequency. Accordingly, the interface may be provided at the circuit apparatus for outputting the measurement result, or the interface may be shared between the output of the measurement result and another purpose.

It is sufficient that the storage unit can store the measurement result of the information corresponding to the frequency measured by the measurement unit. That is, it is sufficient that the measurement result can be retained such that the measurement result can be used at any timing. Accordingly, it is preferable that the storage unit is the non-volatile memory as described above such that operational setting information is retained even when power is stopped and then restarted, and alternatively, a volatile memory may also be used as long as the operational setting information is stored while power is on and can be referenced by the control circuit. Of course, a memory type is not limited.

Further, the terminal as an interface for receiving the first signal S1 in the oscillator 1 may be shared with another terminal. For example, the first signal S1 may be input from the external apparatus to the oscillator 1 using a terminal electrically connected to the serial interface circuit 80. For example, it is possible to adopt a configuration in which the first signal S1 is received via the SDA terminal and the serial interface circuit 80 after the oscillator 1 transitions to the test mode in the configuration shown in FIG. 1.

This configuration can be implemented by, for example, a configuration in which, after a command for transmitting the first signal S1 is output from the external apparatus to the oscillator 1, the first signal S1 of predetermined duration is output from the external apparatus to the oscillator 1. In this case, the serial interface circuit 80 supplies the first signal S1 to the measurement unit 30, and the measurement unit 30 counts the number of pulses using the frequency divider circuit based on the first signal S1. According to the above configuration, it is not necessary to provide the terminal TS1 for only the first signal S1 at the oscillator 1, and the oscillator 1 can be implemented with a simple configuration.

What is claimed is:

1. A circuit apparatus comprising:
an oscillation control circuit configured to control oscillation of a resonator;
a counter circuit configured to count a number of pulses of an oscillation signal output from the oscillation control circuit; and
an interface configured to communicate with an external device, wherein
when a first signal that determines a measurement period is received from outside, the counter circuit counts the number of pulses of the oscillation signal output during the measurement period, and
the interface outputs a measurement result of the number of pulses corresponding to a frequency of the oscillation signal to the external device.

2. The circuit apparatus according to claim 1, further comprising:
a memory configured to store the measurement result counted by the counter circuit, wherein
the interface outputs the measurement result stored in the memory to the external device.

3. The circuit apparatus according to claim 1, wherein
the circuit apparatus has a normal mode and a test mode, and
the counter circuit counts the number of pulses corresponding to the frequency when the test mode is instructed from the external device.

4. The circuit apparatus according to claim 3, wherein
the interface receives a command related to the test mode from the external device, and the circuit apparatus transitions from the normal mode to the test mode.

5. The circuit apparatus according to claim 2, wherein
the counter circuit counts the number of pulses corresponding to the frequency for each of different temperatures, and
the memory stores the measurement result for each of the different temperatures.

6. The circuit apparatus according to claim 2, further comprising:
a correction circuit configured to correct a temperature characteristic of the resonator, wherein
the interface receives temperature compensation data used for correction performed by the correction circuit,
the counter circuit counts the number of pulses corresponding to the frequency in a state where the correction circuit corrects the temperature characteristic using the received temperature compensation data, and
the memory stores the measurement result for each of correction coefficients.

7. The circuit apparatus according to claim 3, wherein
the interface receives the first signal after the circuit apparatus transitions to the test mode.

8. The circuit apparatus according to claim 1, further comprising:
an input terminal configured to receive the first signal separately from the interface.

9. An oscillator comprising:
a resonator;
an oscillation control circuit configured to control oscillation of the resonator;
a counter circuit configured to count a number of pulses of an oscillation signal output from the oscillation control circuit; and
an interface configured to communicate with an external device, wherein
when a first signal that determines a measurement period is received from the external device, the counter circuit counts the number of pulses of the oscillation signal output during the measurement period, and
the interface outputs a measurement result of the number of pulses corresponding to a frequency of the oscillation signal to the external device.

10. The oscillator according to claim 9, further comprising:
a memory configured to store the measurement result counted by the counter circuit, wherein
the interface outputs the measurement result stored in the memory to the external device.

11. The oscillator according to claim 9, wherein the oscillator has a normal mode and a test mode, and the counter circuit counts the number of pulses corresponding to the frequency when the test mode is instructed from the external device.

12. The oscillator according to claim 11, wherein the interface receives a command related to the test mode from the external device, and the oscillator transitions from the normal mode to the test mode.

13. The oscillator according to claim 10, wherein the counter circuit counts the number of pulses corresponding to the frequency for each of different temperatures, and the memory stores the measurement result for each of the different temperatures.

14. The oscillator according to claim 10, further comprising:

a correction circuit configured to correct a temperature characteristic of the resonator, wherein the interface receives temperature compensation data used for correction performed by the correction circuit, the counter circuit counts the number of pulses corresponding to the frequency in a state where the correction circuit corrects the temperature characteristic using the received temperature compensation data, and the memory stores the measurement result for each of correction coefficients.

15. The oscillator according to claim 11, wherein the interface receives the first signal after the circuit apparatus transitions to the test mode.

16. A circuit apparatus comprising:

an oscillation control circuit configured to control oscillation of a resonator;

a measurement unit configured to measure information corresponding to a frequency of an oscillation signal output from the oscillation control circuit; and an interface, wherein when a first signal that determines a measurement period is received from outside, the measurement unit measures the information corresponding to the frequency of the oscillation signal output during the measurement period, the interface outputs a measurement result of the information corresponding to the frequency, the circuit apparatus has a normal mode and a test mode, the measurement unit measures the information corresponding to the frequency when the test mode is instructed from the outside, and the interface receives the first signal after the circuit apparatus transitions to the test mode.

17. The circuit apparatus according to claim 16, further comprising:

a storage unit configured to store the measurement result of the information corresponding to the frequency measured by the measurement unit, wherein the interface outputs the measurement result stored in the storage unit to the outside.

18. The circuit apparatus according to claim 16, wherein the interface receives a command related to the test mode from the outside and the circuit apparatus transitions from the normal mode to the test mode.

19. The circuit apparatus according to claim 17, wherein the measurement unit measures the information corresponding to the frequency for each of different temperatures, and the storage unit stores the measurement result for each of the temperatures.

20. The circuit apparatus according to claim 17, further comprising:

a correction unit configured to correct a temperature characteristic of the resonator, wherein the interface receives temperature compensation data used for correction performed by the correction unit, the measurement unit measures the information corresponding to the frequency in a state where the correction unit corrects the temperature characteristic using the received temperature compensation data, and the storage unit stores the measurement result for each of correction coefficients.

* * * * *